(12) United States Patent
Ohsawa

(10) Patent No.: US 7,787,293 B2
(45) Date of Patent: Aug. 31, 2010

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 384 days.

(21) Appl. No.: 12/031,111

(22) Filed: Feb. 14, 2008

(65) Prior Publication Data
US 2008/0212366 A1 Sep. 4, 2008

(30) Foreign Application Priority Data
Mar. 1, 2007 (JP) ............... 2007-051404

(51) Int. Cl.
*G11C 11/34* (2006.01)
(52) U.S. Cl. ........... 365/174; 365/182; 365/185.05; 365/185.26
(58) Field of Classification Search ......... 365/174, 365/182, 189.011, 185.05, 185.26; 257/314, 257/344
See application file for complete search history.

(56) References Cited

U.S. PATENT DOCUMENTS

| | | | | |
|---|---|---|---|---|
| 6,650,565 | B1 * | 11/2003 | Ohsawa | 365/185.05 |
| 7,433,242 | B2 * | 10/2008 | Ohsawa | 365/185.27 |
| 7,463,523 | B2 * | 12/2008 | Shino | 365/185.18 |
| 7,692,963 | B2 * | 4/2010 | Shino et al. | 365/185.05 |
| 2002/0011612 | A1 | 1/2002 | Hieda | |
| 2005/0104119 | A1 | 5/2005 | Diorio et al. | |
| 2005/0224878 | A1 | 10/2005 | Chang | |
| 2005/0285204 | A1 | 12/2005 | Kim et al. | |
| 2007/0007574 | A1 | 1/2007 | Ohsawa | |

OTHER PUBLICATIONS

T. Tanaka, et al., "Scalability Study on a Capacitorless 1T-Dram: From Single-gate PD-SOI to Double-gate FinDRAM", 2004 IEEE, IEDM, pp. 37.5.1-37.5.4.

* cited by examiner

*Primary Examiner*—Tuan T Nguyen
*Assistant Examiner*—Toan Le
(74) *Attorney, Agent, or Firm*—Oblon, Spivak, McClelland, Maier & Neustadt, L.L.P.

(57) ABSTRACT

This disclosure concerns a semiconductor memory device including Fin semiconductors extending in a first direction; source layers provided in the Fin semiconductors; drain layers provided in the Fin semiconductors; floating bodies provided in the Fin semiconductors between the source layers and the drain layers, the floating bodies being in an electrically floating state and accumulating or discharging carries so as to store data; first gate electrodes provided in first grooves located between the Fin semiconductors adjacent to each other; second gate electrodes provided in second grooves adjacent to the first grooves and located between the Fin semiconductors adjacent to each other; bit lines connected to the drain layers, and extending in a first direction; word lines connected to the first gate electrodes, and extending in a second direction orthogonal to the first direction; and source lines connected to the source layers, and extending in the second direction.

15 Claims, 15 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2007-51404, filed on Mar. 1, 2007, the entire contents of which are incorporated herein by reference.

BACKGROUND OF THE INVENTION

1. Field of the Invention

The present invention relates to a semiconductor memory device.

2. Related Art

In recent years, there is known an FBC memory device as a semiconductor memory device expected to replace a 1T (Transistor)-1C (Capacitor) DRAM. The FBC memory device is configured so that FETs (Field Effect Transistors) each including a floating body (hereinafter, also "body") are formed on an SOI (Silicon On Insulator) substrate, and so that data "1" or "0" is stored in each FET according to the number of majority carriers accumulated in the body of the FET.

Conventionally, capacitive coupling between the body and the substrate (fixed potential) is set strong so as to increase a signal difference (threshold voltage difference between the data "0" and "1") of the FBC memory device. As one of methods of setting the capacitive coupling strong, a buried insulating film (BOX layer) of the SOI substrate is made thin. However, if the BOX layer is thin, a BOX layer under logic transistors loaded in mixture with the FBCs is made thin. Due to this, a capacity of a source or a drain of each of the logic transistors increases, disadvantageously resulting in decelerating operation performed by the logic transistor. Besides, the SOI substrate including the thin BOX layer is expensive. Considering these disadvantages, a technique for adopting FinFETs as FBCs is disclosed (T. Tanaka et al., "Scalability Study of a Capacitorless 1T-DRAM:From Single-gate PD-SOI to Double-gate FinDRAM", IEDM Tech. Dig., pp. 919-922, December 2004 (hereinafter, "Non-patent document 1")). However, if the FinFETs disclosed in the Non-patent document 1 are adopted, a memory cell array is disadvantageously made large in size.

SUMMARY OF THE INVENTION

A semiconductor memory device according to an embodiment of the present invention comprises a plurality of Fin semiconductors extending in a first direction; source layers provided in the Fin semiconductors; drain layers provided in the Fin semiconductors; floating bodies provided in the Fin semiconductors between the source layers and the drain layers, the floating bodies being in an electrically floating state and accumulating or discharging carries so as to store data; first gate electrodes provided in first grooves located between the Fin semiconductors adjacent to each other; second gate electrodes provided in second grooves adjacent to the first grooves and located between the Fin semiconductors adjacent to each other; bit lines connected to the drain layers, and extending in a first direction; word lines connected to the first gate electrodes, and extending in a second direction orthogonal to the first direction; and source lines connected to the source layers, and extending in the second direction.

DETAILED DESCRIPTION OF THE INVENTION

Embodiments of the present invention will be explained below in detail with reference to the accompanying drawings. Note that the invention is not limited thereto.

First Embodiment

Figure 1:
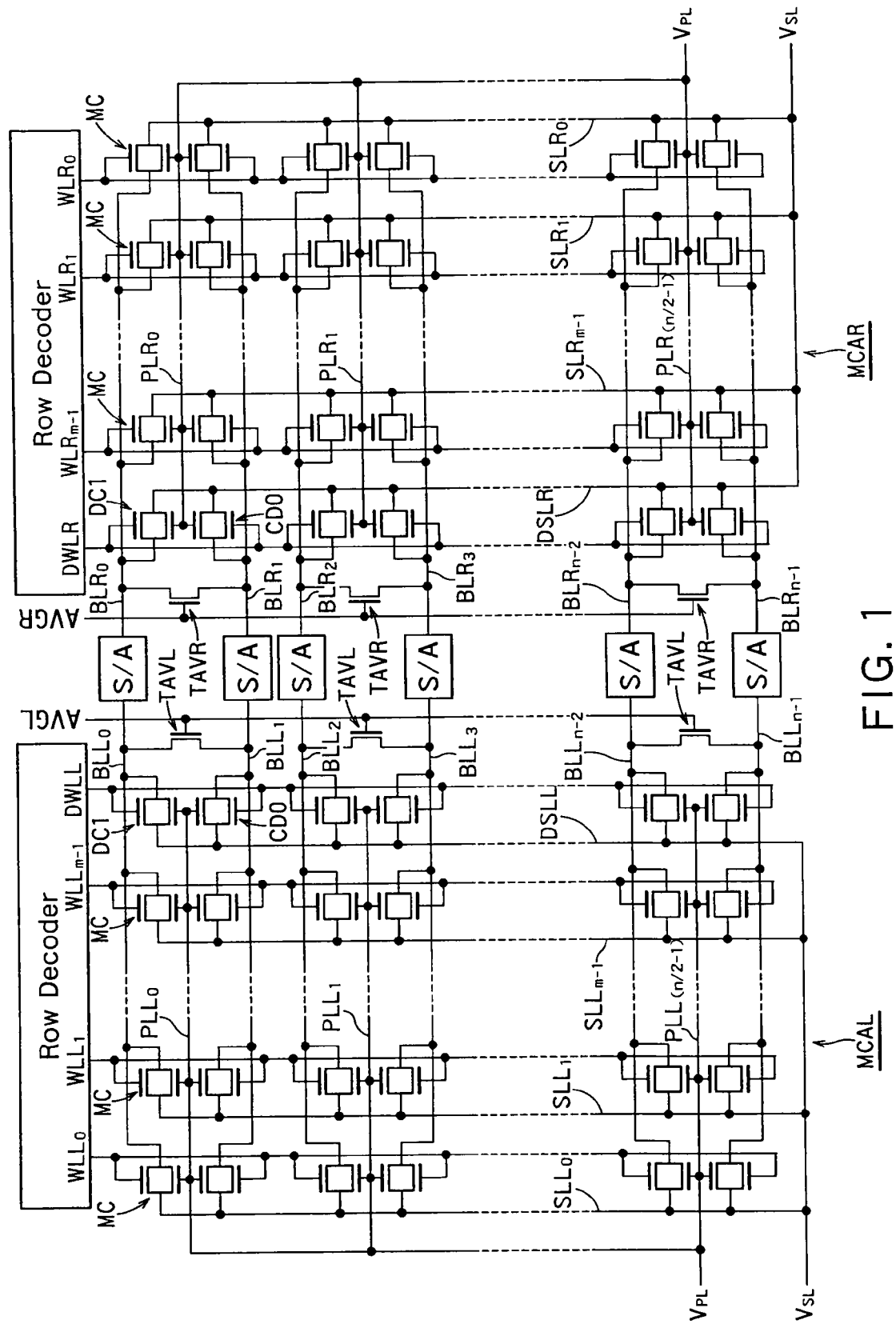
FIG. 1 is a circuit diagram of an FBC memory device according to a first embodiment of the present invention.

FIG. 1 is a circuit diagram of an FBC memory device according to a first embodiment of the present invention. The FBC memory device includes memory cells MCs, a first dummy cell DC0, a second dummy cell DC1, word lines WLLs and WLRs (hereinafter, also "WLs"), dummy word lines DWLL and DWLR (hereinafter, also "DWLs"), bit lines BLLs and BLRs (hereinafter, also "BLs"), sense amplifiers S/As, averaging lines AVGL and AVGR (hereinafter, also "AVG"), averaging transistors TAVLs and TAVRs (hereinafter, also "TAVs"), plate lines PLLs and PLRs (hereinafter, also "PLs"), source lines SLLs and SLRs (hereinafter, also "SLs"), and dummy source lines DSLL and DSLR (hereinafter, also "DSLs").

The memory cells MCs are arranged in a matrix and constitute memory cell arrays MCAL and MCAR (hereinafter, also "MCAs"). The memory cell arrays MCAL and MCAR are provided on both sides of the sense amplifiers S/As, respectively. Each of the word lines WLs extends in a row direction that is a second direction, and is connected to a first gate electrode of each memory cell MC. The number of word lines WLs arranged on each of the left and right of the sense amplifiers S/As is m. In FIG. 1, m word lines WLs on the left are denoted by WLL0 to WLLm−1 and those on the right are denoted by WLR0 to WLRm−1. The 'm' is an integer such as 256 or 512. Each of the bit lines BLs extends in a column direction that is a first direction, and is connected to a drain of each memory cell MC. The number of bit lines BLs arranged on each of the left and right of the sense amplifiers S/As is n. In FIG. 1, n bit lines BLs on the left are denoted by BLL0 to BLLn−1 and those on the right are denoted by BLR0 to BLRn−1. The 'n' is an integer such as 512 or 1024. The first and second directions are orthogonal to each other. Namely, the word lines WLs and the bit lines BLs are orthogonal to each other. The memory cells MCs are provided at cross points between the word lines WLs and the bit line BLs, respectively. The memory cells MCs are, therefore, called "cross-point cells". Note that the second direction (row direction) and the first direction (column direction) are referred for descriptive purposes, therefore, they can be replaced by each other.

Each of the plate lines PLs extends in the first direction similarly to the bit lines BLs, and is connected to a second gate electrode of each memory cell MC. The number of plate lines PLs arranged on each of left and right of the sense amplifiers S/As is n/2. In FIG. 1, n/2 plate lines PLs on the left are denoted by PLL0 to PLL(n/2−1) and those on the right are denoted by PLR0 to PLR(n/2−1). Namely, one plate line PL is provided to correspond to (to be shared between) the two bit lines BLs adjacent to each other.

Each of the source lines SLs extends in the second direction, and is connected to a source of each memory cell MC. The number of source lines SLs arranged on each of left and right of the sense amplifiers S/As is m. In FIG. 1, m source lines SLs on the left are denoted by SLL0 to SLLm−1 and those on the right are denoted by SLR0 to SLRm−1. Namely, the source lines SLs are provided to correspond to the respective word lines WLs.

Before a data read operation, the dummy cells DC0 and DC1 store therein data "0" and data "1" having reverse polarities with respect to each other, respectively. Normally, the data is written to each of the dummy cells DC0 and DC1 right after power is turned on or data is written to the associated cell array. A polarity indicates a logic value "0" or "1" of data. The dummy cells DC0 and DC1 are used to generate a reference current Iref when data stored in each memory cell MC is to be detected. The reference current Iref is almost intermediate between a current carried across a memory cell storing therein data "0" (hereinafter, also "0" cell) and a current carried across a memory cell storing therein data "1" (hereinafter, also "1" cell). A current mirror circuit (not shown) included in each sense amplifier S/A applies a current to each memory cell MC via the corresponding bit line BL. A current according to the data stored in the memory cell MC is thereby carried across sense nodes in the sense amplifier S/A. The sense amplifier S/A discriminates whether the logic value of the data is "0" or "1" depending on whether the current carried across the sense nodes is lower or higher than the reference current Iref.

The dummy cells DC0 and DC1 are alternately arranged in the second direction in which the dummy word lines DWLs extend. To generate the reference current Iref, the dummy cells DC0 are provided to be as many as the dummy cells DC1.

Each of the dummy word lines DWLs extends in the second direction, and is connected to a gate of each dummy cell DC. One dummy word line DWL is provided on each of left and right of the sense amplifiers S/As. In FIG. 1, the dummy word lines DWLs on the left and right are denoted by DWLL and DWLR, respectively. Each of the dummy source lines DSLL and DSLR similarly extends in the second direction, and is connected to a source of each dummy cell DC. One dummy source line DSL is provided on each of left and right of the sense amplifiers S/As.

Each of the averaging lines AVGs is connected to a gate of each averaging transistor TAV. Each averaging transistor TAV is connected between the two adjacent bit lines BLs, and the averaging transistors TAVs are connected in series. The averaging transistors TAVs short the dummy cells DC0 and the dummy cells DC1 as many as the dummy cells DC0 during the data read operation, thereby averaging a current carried across the dummy cells DC0 and DC1 and generating the reference current Iref.

The FBC memory device also includes equalizing lines EQLs (not shown) and equalizing transistors TEQs (not shown) to equalize a potential of each bit line BL to a ground potential. Each of the equalizing lines EQLs is connected to a gate of each equalizing transistor TEQ. Each equalizing transistor TEQ is connected between a bit line BL and a ground.

Figure 2:
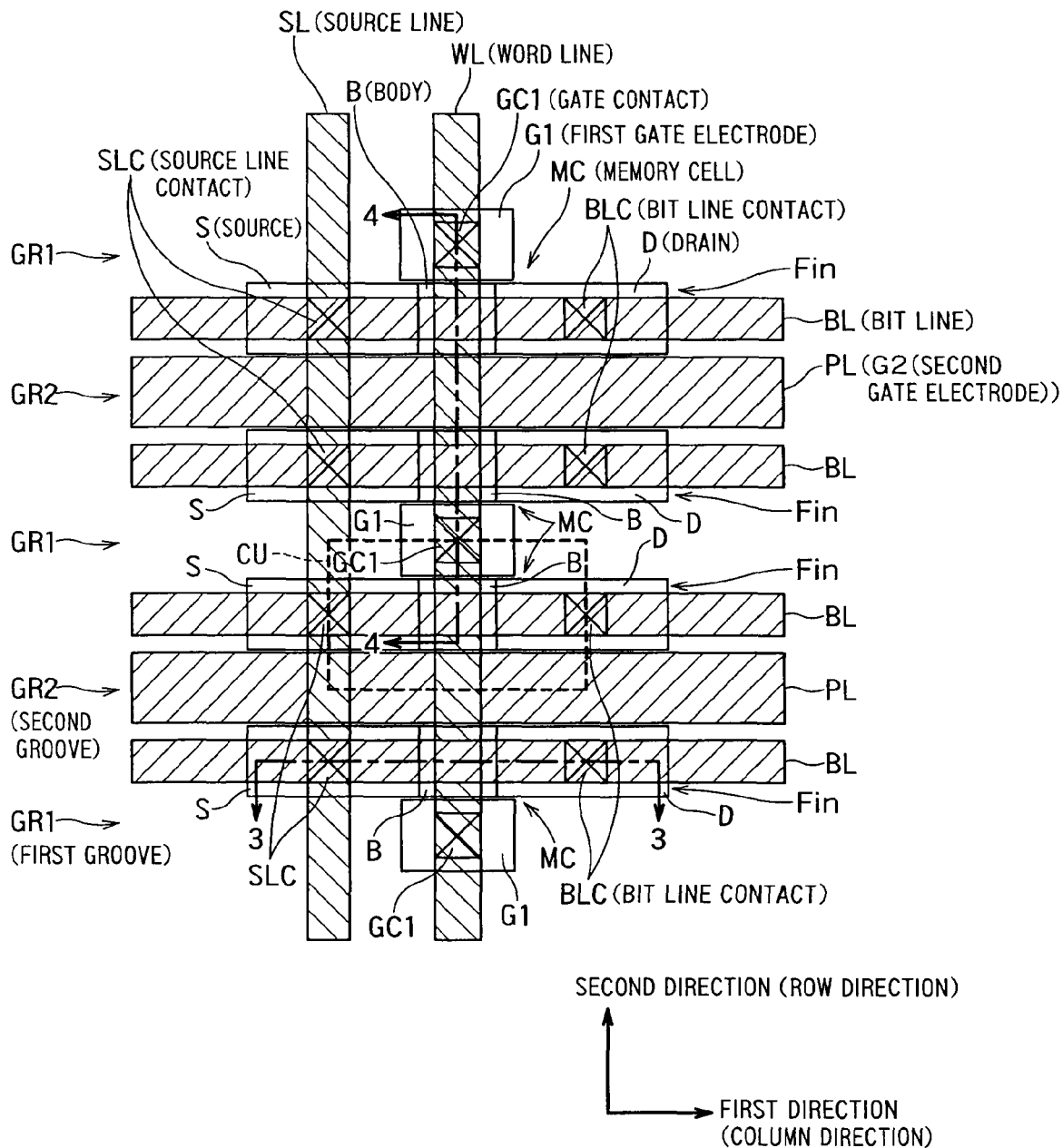
FIG. 2 is a plan view showing four memory cells MCs adjacent in the second direction.

FIG. 2 is a plan view showing four memory cells MCs adjacent in the second direction (row direction). A plurality of Fin semiconductors Fins extend in the first direction (column direction) in the form of stripes. The Fin semiconductors Fins can be formed by etching an SOI layer of the SOI substrate up to a BOX (Buried Oxide) layer into stripes. The Fin semiconductors Fins are thereby provided on the BOX layer. The Fin semiconductors Fins are made of, for example, silicon.

A source layer S, a drain layer D, and a body B are provided in each of the Fin semiconductors Fins. The body B is provided between the source layer S and the drain layer D. The source layer S and the drain layer D are made of an N-type semiconductor and the body B is made of a P-type semiconductor. Namely, the memory cells MCs are assumed as N-MISFETs. The body B is in an electrically floating state and majority carriers are accumulated or discharged in or from the body B so as to store data in each memory cell MC. A state in which the number of holes accumulated in the body B is large is defined as data "1" and a state in which the number of holes accumulated in the body B is small is defined as data "0".

Although not shown in FIG. 2, the source layer S can be shared between the two memory cells MCs adjacent to each other. Likewise, the drain layer D can be shared between the two memory cells MCs adjacent to each other.

Each of grooves GR1 and GR2 (hereinafter, also "GRs") extending in the first direction is formed between the two adjacent Fin semiconductors Fins. The grooves GR1 and GR2 appear alternately in the second direction and are arranged in order of GR1, GR2, GR1, GR2 . . . . If the grooves GR1 are first grooves and the grooves GR2 are second grooves, then a first gate electrode G1 is provided in each of the first grooves GR1, and the plate line PL serving as the second gate electrode is provided in each of the second grooves GR2. Namely, the first gate electrodes G1 and the plate lines PLs are alternately buried in the second direction. One first gate electrode G1 is thereby shared between the two memory cells MCs adjacent to each other and arranged on both sides of the first gate electrode G1, respectively. One plate line PL is shared between the two memory cells MCs adjacent to each other in the second direction (in the row direction) and arranged on both sides of the plate line PL, respectively. Each of the first gate electrodes G1 is provided on a first side surface of the body B via a first gate insulating film. Each of the plate lines PLs is provided on a second side surface of the body B opposite to the first side surface thereof via a second gate insulating film. The first gate electrode G1 and the plate line PL are configured to be able to apply voltages to the body B from the both side surfaces of the body B, respectively.

One bit line BL extends in the first direction (column direction) similarly to the Fin semiconductors Fins, and is connected to the drain layers D of a plurality of memory cells MCs adjacent in the first direction via bit line contacts BLCs, respectively. One source line SL extends in the second direction (row direction), and is connected to source layers S of a plurality of memory cells MCs adjacent in the second direction via source line contacts SLCs, respectively. One word line WL extends in the second direction, and is connected to the first gate electrodes G1 of a plurality of memory cells MCs adjacent in the second direction via gate contacts GC1, respectively. One plate line PL extends in the first direction within one second groove GR2.

The first gate electrodes G1 and the plate lines PLs are made of, for example, polysilicon. Each of the plate lines PLs functions as both a back gate (second gate electrode G2) and as a plate line.

Figure 3:
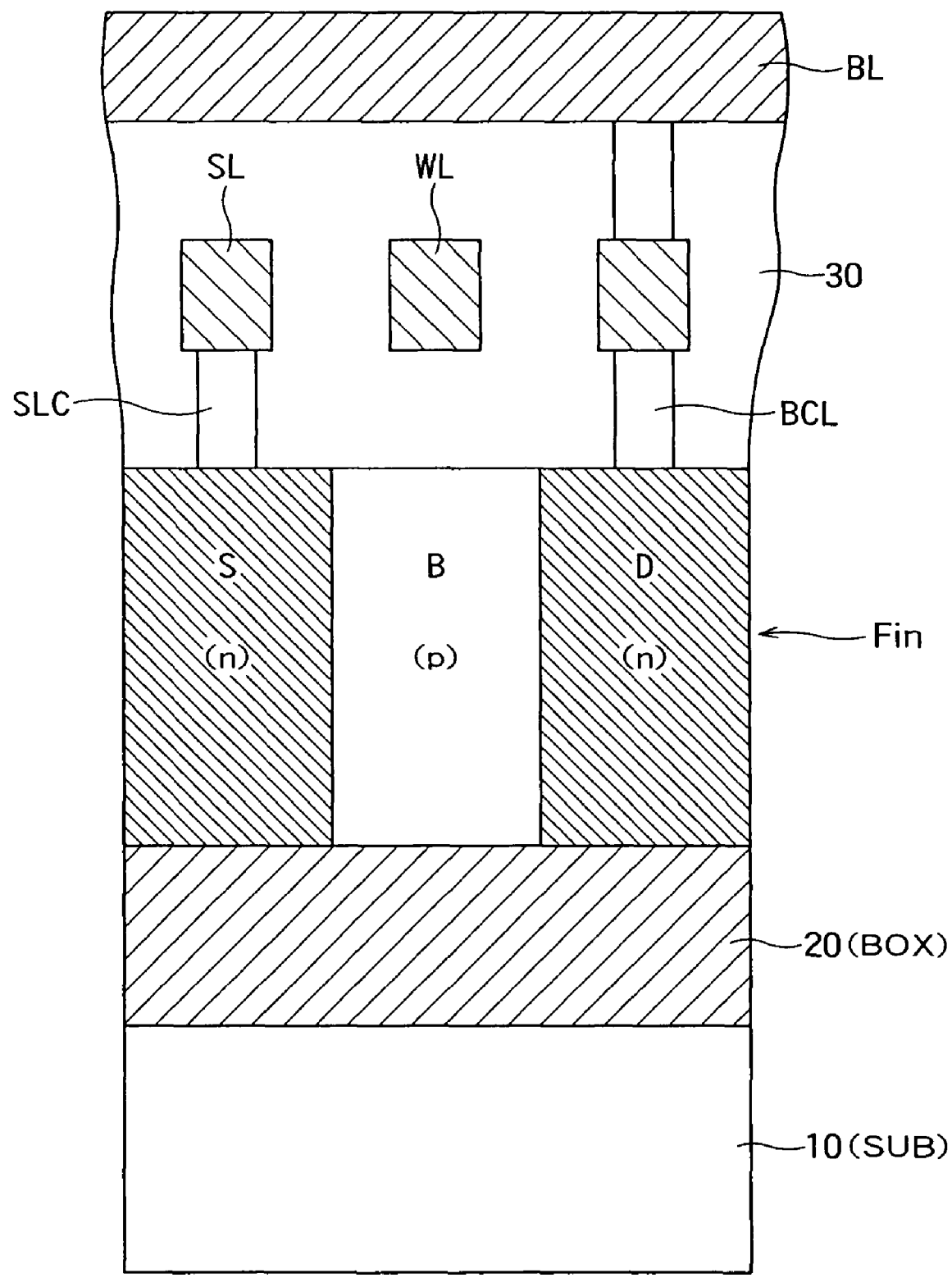
FIG. 3 is a cross-sectional view of one memory cell MC taken along a line 3-3 of FIG. 2.

FIG. 3 is a cross-sectional view of one memory cell MC taken along a line 3-3 of FIG. 2 (in the first direction (column direction)). A BOX layer 20 is provided on a silicon substrate 10, and a Fin semiconductor (SOI layer) is provided on the BOX layer 20. If each of the source layer S and the drain layer D is shared between the memory cells MCs adjacent to each other in the first direction, the source layers S, the bodies B, and the drain layers D are arranged in order of S, B, D, B, S, B, D, B . . . in the Fin semiconductors in a direction along a bit line BL. Each source layer S is connected to one source line SL via the source line contact SLC, and each drain layer D is connected to one bit line BL via the bit line contact BLC.

The word line WL and the source line SL are formed on a first metal wiring layer and provided in an interlayer insulating film 30. The bit line BL is formed on a second metal wiring layer.

Figure 4:
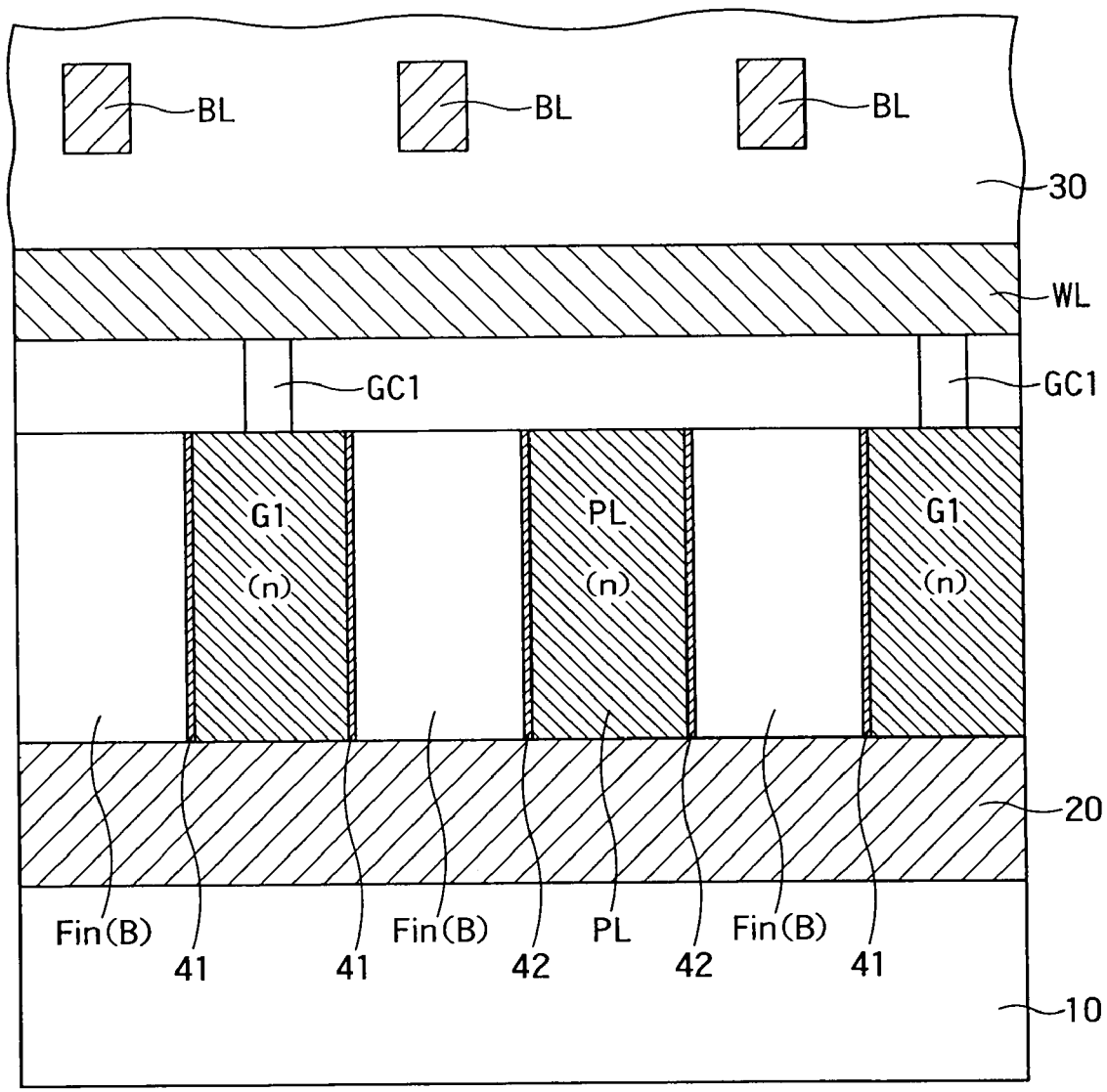
FIG. 4 is a cross-sectional view of the memory cells MCs taken along a line 4-4 of FIG. 2.

FIG. 4 is a cross-sectional view of the memory cells MCs taken along a line 4-4 of FIG. 2 (in the second direction (row direction)). In this cross-sectional view, the Fin semiconductors Fins, the first gate electrodes G1, and the plate lines PLs are arranged in order of Fin, G1, Fin, PL, Fin, G1, Fin, PL . . . . The body B is provided in the Fin semiconductor right under the word line WL. Each first gate electrode G1 is adjacent to one body B via a first gate insulating film 41. Each plate line PL is adjacent to the body B via a second gate insulating film 42. The first gate electrode G1 and the plate line PL (second gate electrode) can thereby control a potential of the body B.

Figure 5:
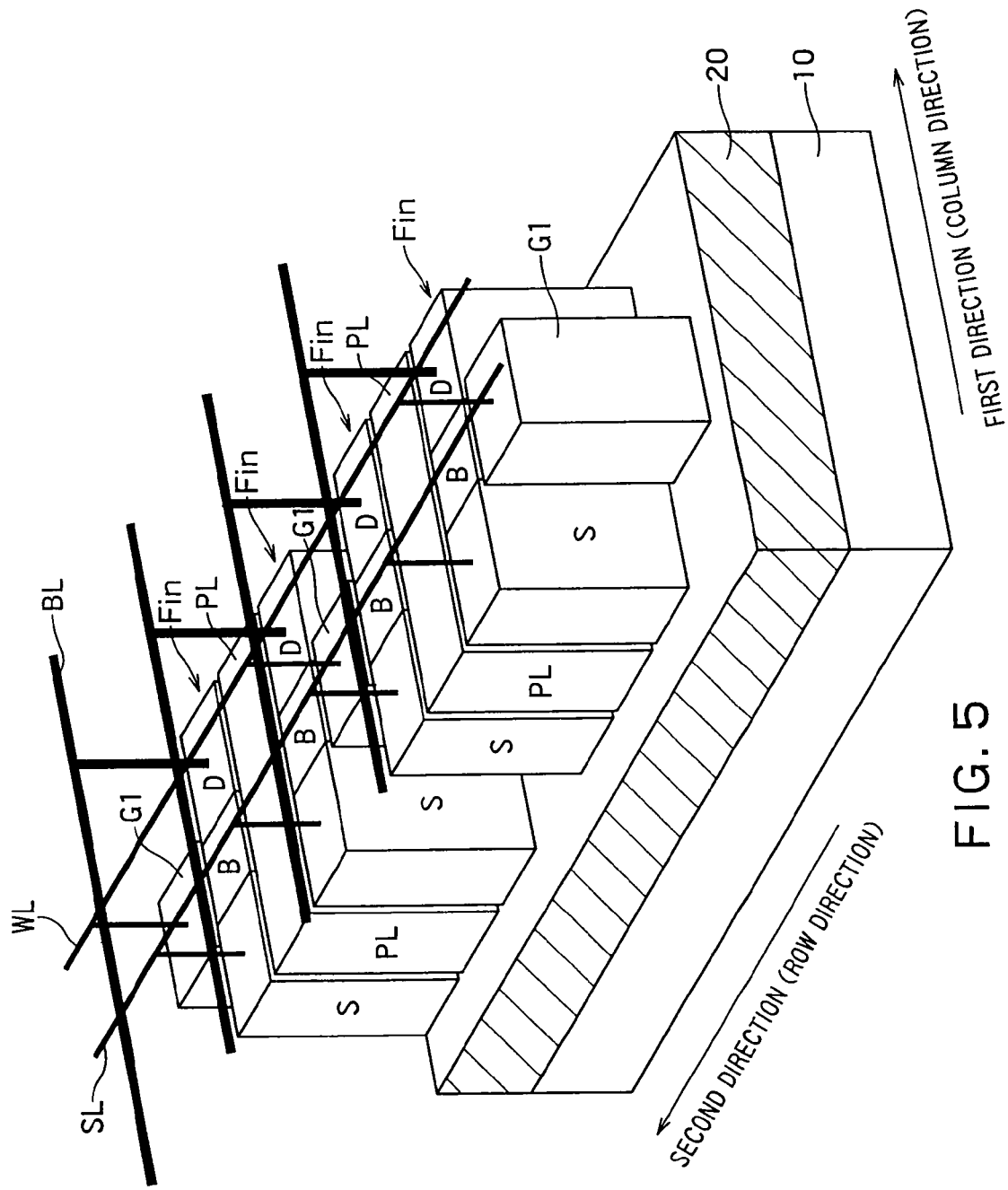
FIG. 5 is a perspective view of the FBC according to the first embodiment.

FIG. 5 is a perspective view of the FBC according to the first embodiment. The first gate electrode G1 is divided in the first direction (column direction) and each of the divided first gate electrodes G1 is individually provided to the two memory cells MCs adjacent to each other in the first direction (column direction), respectively. One word line WL connects the first gate electrodes G1 adjacent to each other in the second direction (row direction) to each other. Therefore, each first gate electrode G1 is common to the two memory cells MCs adjacent to each other in the second direction (row direction). The plate lines PLs in the respective second groove GR2 extend continuously in the first direction (column direction). Each of the plate lines PLs is common to the two memory cells MCs adjacent to each other in the first direction (column direction).

One source line SL connects the source layers S adjacent to each other in the second direction to each other and is, therefore, common to the two memory cells MCs adjacent to each other in the second direction. One bit line BL connects the drain layers D adjacent to each other in the first direction to each other and is, therefore, common to the memory cells MCs adjacent to each other in the first direction.

As can be understood from FIG. 5, the bit lines BLs and the plate lines PLs extend in an extension direction of the Fin semiconductors Fins. The word lines WLs and the source lines SLs extend in an orthogonal direction to the extension direction of the Fin semiconductors Fins.

Figure 6:
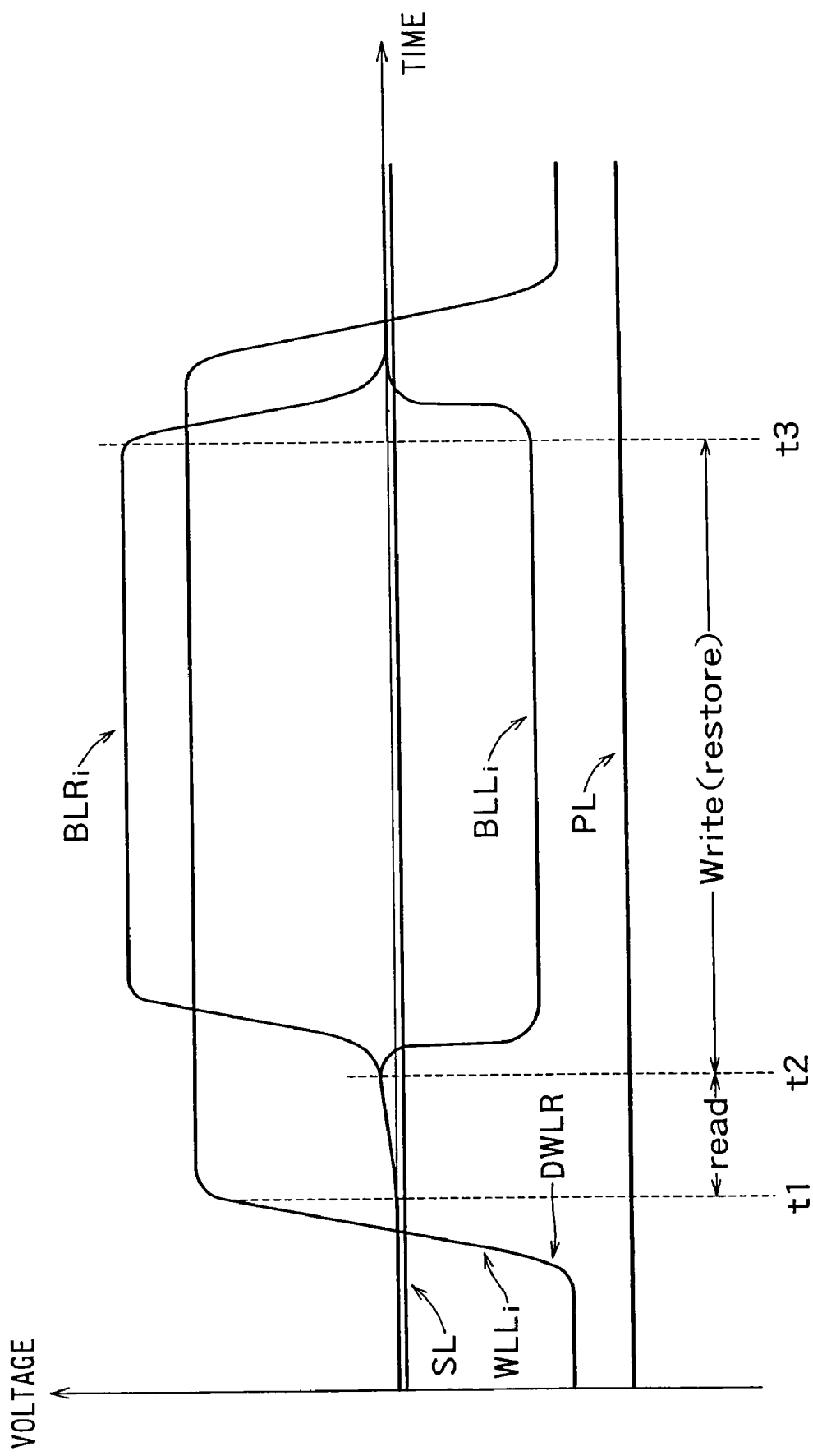
FIG. 6 is a timing chart showing a specific example of waveforms showing operation performed by the memory cells MCs.

FIG. 6 is a timing chart showing a specific example of waveforms showing operation performed by the memory cells MCs. At t1, a selected word line WLLi rises simultaneously with the dummy word line DWLR. The memory cells MCs connected to the selected word line WLLi in the memory cell array MCAL and the dummy cells DCs connected to the dummy word line DWLR in the memory cell array MCAR are thereby connected to the sense amplifiers S/As. At the same time, the averaging line AVGR is activated to short the dummy cells DC1 and the dummy cells DC0. As a result, a current (I1+I0)/2 that is intermediate between a current I1 for the "1" cells and a current I0 for the "0" cells flows the sense amplifiers S/As. The current (I1+I0)/2 is used herein as the reference current Iref.

In a data read operation for reading data to the sense amplifiers S/As, a potential of the word line WLL is set to be as high as that of the word line WLLi in a data write operation but a potential of each bit line BL is set to a lower potential than that of the bit line BL in the data write operation. For example, the potential of the word line WL is set to 1.5 V and that of the bit line BL is set to 0.2 V. The memory cells MCs are caused to operate in a linear region. The "0" cells differ in threshold voltage from the "1" cells due to a difference in the number of holes accumulated in the body B. Because of the difference in threshold voltage, a current of selected memory cells MCs (cell current Icell) differs between a current in an instance in which the selected memory cells MCs are "1" cells and a current in an instance in which the selected memory cells MCs are "0" cells. Accordingly, each sense amplifier S/A determines a polarity of data stored in each of the selected memory cell MCs by comparing the cell current Icell from the memory cell array MCAL with the reference current Iref. Furthermore, the sense amplifier S/A latches the data the polarity of which is determined. In this manner, the sense amplifier S/A reads the data from the memory cell MC.

From t2 to t3, the sense amplifier S/A rewrites (restores) the latched data to the memory cells MCs. In the first embodiment, it is assumed that a selected memory cell MC stores therein data "0". It is also assumed that the dummy cell DC connected to the sense amplifier S/A to which the selected memory cell MC is connected stores therein data "1".

To write data "1" to a memory cell MC, the memory cells MC is caused to operate in a saturation state. For example, the potential of the word line WL is biased to 1.5 V and that of the bit line BL is biased to 1.5 V. A potential of the source line SL is set to a ground GND (0 V). By so setting, impact ionization occurs near the drain layer D of the memory cell MC to thereby generate many pairs of electrons and holes. The electrons generated by the impact ionization flow to the drain layer D of the memory cell MC and the holes are accumulated in the low potential body B thereof. A body voltage turns into an equilibrium state when a balance is held between a current flowing when the holes are generated by the impact ionization and a forward current at a pn junction between the body B and the source S of the memory cell MC. The body voltage is about 0.7 V. The same is true for an operation for writing data "1" to the dummy cells DCs.

To write data "0" to a memory cell MC, the potential of the bit line BL connected to the memory cell MC is reduced to low voltage. For example, the potential of the bit line BL is reduced to −1.5 V. As a result of this operation, a pn junction between the body B and the drain layer D of the memory cell MC is biased largely in a forward direction. The holes accumulated in the body B of the memory cell MC are discharged to the drain layer D, thereby writing data "0" to the memory cell MC. The same is true for an operation for writing data "0" to a dummy cell DC.

In the first embodiment, after the sense amplifiers S/As latch data, potentials of driven bit lines BLLs are applied to the selected memory cells MCs connected to the respective bit lines BLLs. On the other hand, in the first embodiment, a potential of each bit line BLR driven by a dummy cell writing circuit (not shown) is applied to the dummy cell DC0 connected to the bit line BLR. As a result, a data restore operation is completed.

Note that a source line voltage VSL and a plate line voltage VPL are always constant. For example, the source line voltage VSL is 0 V (ground potential) and the plate line voltage VPL is −1 V.

A series of operations shown in FIG. 6 is applicable to a data read operation for reading data from the memory cells MCs to outside, a data write operation for writing data to the memory cells MCs from the outside, and a refresh operation. The refresh operation is identical to the data read operation except that a column selection line is not driven. Further, if the data read from one memory cell MC to the sense amplifier S/A is equal in polarity to the data from the outside, the data write operation is performed similarly to the operation shown in FIG. 6. If the data read from one memory cell MC to the sense amplifier S/A is reversed in polarity with respect to the data from the outside, the data write operation is performed similarly to that shown in FIG. 6 except that the potentials of the bit lines BLLs and BLRs are inverted halfway.

Effects of the first embodiment are described below.

Generally, a FinFET is configured so that both side surfaces and an upper surface of a Fin semiconductor are covered with gate electrodes, respectively. In the first embodiment, the gate electrodes are divided in an upper portion of the Fin semiconductor so that gates on the respective both side surfaces of the Fin semiconductor can apply independent voltages to the body B. The gate electrode located on one side surface of the Fin semiconductor is referred to as "first gate electrode G1" and that located on the other side surface is referred to as "plate line PL". Such a configuration enables majority carries to be held in the body B by applying a negative potential to the plate line PL even if the memory cell MC is a fully-depletion FBC (FD-FBC).

To allow the two memory cells MCs adjacent to each other in the second direction to share the first gate electrode G1 therebetween, the first gate electrode G1 should be separated between the memory cells MCs adjacent to each other in the first direction for the following reason. If the first gate electrode G1 is continuous in the first direction, then the first gate electrode G1 is common to all the memory cells MCs formed in the two adjacent Fin semiconductors, and a single memory cell MC cannot be eventually selected. For the same reason, it is necessary that each of the word lines WLs extends in the orthogonal direction (second direction) to the extension direction of the Fin semiconductors (first direction). Each of the word lines WLs is connected to the first gate electrodes G1 adjacent to each other in the second direction.

Meanwhile, each of the bit lines BLs extends in the first direction, and is connected to the drain layer D formed in one Fin semiconductor. By doing so, when one word line WL is activated, data stored in the memory cells MCs corresponding to the word line WL and adjacent in the second direction is transmitted to different bit lines BLs, respectively. Further, the word line WL needs to be perpendicular to the bit lines BLs and to be parallel to the source lines SLs so that the corresponding sense amplifier S/A can correctly access the selected memory cells MCs among those arranged two-dimensionally. Note that no problem occurs even if each of the plate lines PLs is continuous in the first direction.

According to the Non-patent document 1, the word lines WLs extend in parallel to the extension direction of the Fin semiconductors. Accordingly, the bit lines BLs extend in the orthogonal direction to the extension direction of the Fin semiconductors. If the word lines WLs are parallel to the Fin semiconductors, then each of the word lines WLs cannot be shared between two adjacent Fin semiconductors but should be provided to correspond to each Fin semiconductor. Furthermore, it is necessary to provide a space between the two adjacent word lines WLs so as to prevent short-circuit or capacitive coupling between the two word lines WLs. As a result, there is no avoiding making the semiconductor memory device large in size by as much as such extra spaces.

According to the first embodiment, by contrast, the first gate electrode G1 is divided into a plurality of first gate electrodes G1 each corresponding to the two memory cells MCs adjacent to each other in the first direction. Besides, the word lines WLs extend in the second direction. By adopting such a configuration, each first gate electrode G1 can be shared between the two memory cells MCs adjacent to each other in the second direction. Namely, the FBC memory device according to the first embodiment can dispense with spaces between the adjacent word lines WLs. As a result, the FBC memory device can be downsized as compared with the conventional memory device.

In the first embodiment, the word lines WLs, the bit lines BLs, and the source lines SLs can be formed on different wiring layers. For example, the source lines SLs can be formed on a metal wiring layer serving as a first metal layer, the word lines WLs can be formed on a metal wiring layer serving as a second metal layer, and the bit lines BLs can be formed on a metal wiring layer serving as a third metal layer.

Modification of First Embodiment

Figure 7:
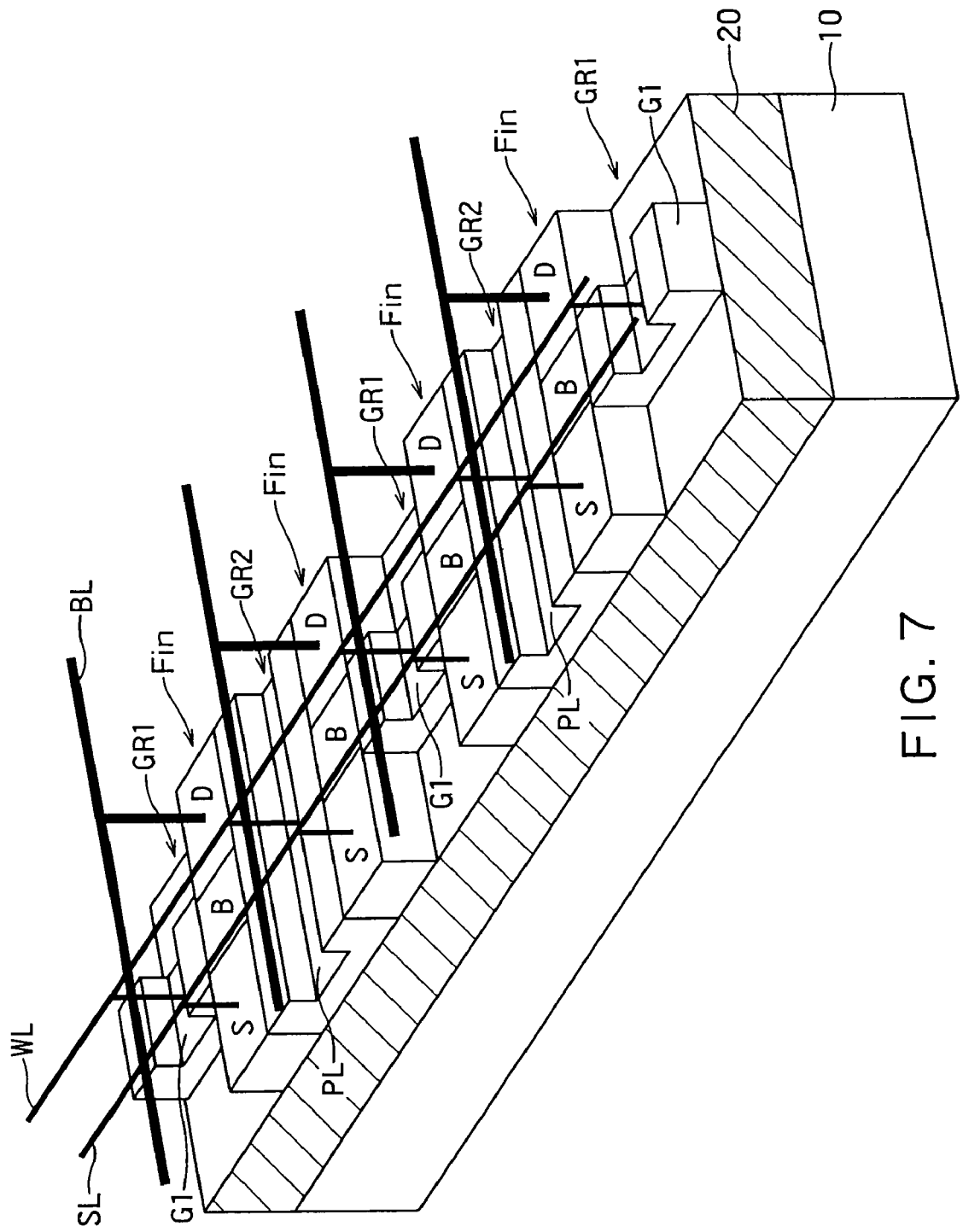
FIG. 7 is a perspective view of an FBC memory device according to a modification of the first embodiment.

In the first embodiment, the first gate electrodes G1 and the plate lines PLs are filled up in the first grooves GR1 and the second grooves GR2, respectively up to an upper surface level of each of the Fin semiconductors. Namely, each of the first gate electrodes G1 and the plate lines PLs is a rectangular parallelepiped. However, it suffices that the first gate electrodes G1 and the plate lines PLs are filled up in the side surfaces of the Fin semiconductors up to the upper surface level of each Fin semiconductor. Namely, as shown in FIG. 7, it suffices that each of the first gate electrodes G1 and the plate lines PLs can be configured to be recessed in a central portion of the upper surface of each Fin semiconductor. In this case, each first gate electrode G1 and each plate line PL are formed into concave shapes along inside surfaces of the first and second grooves GR1 and GR2, respectively in a cross section in the perpendicular direction to the first direction. If the first and second grooves GR1 and GR2 are sufficiently wide relatively to a thickness of polysilicon that is a material for the first gate electrodes G1 and the plate lines PLs, the first gate electrodes G1 and the plate lines PLs are formed as shown in FIG. 7. The modification of the first embodiment exhibits the same advantages as those of the first embodiment.

Second Embodiment

Figure 8:
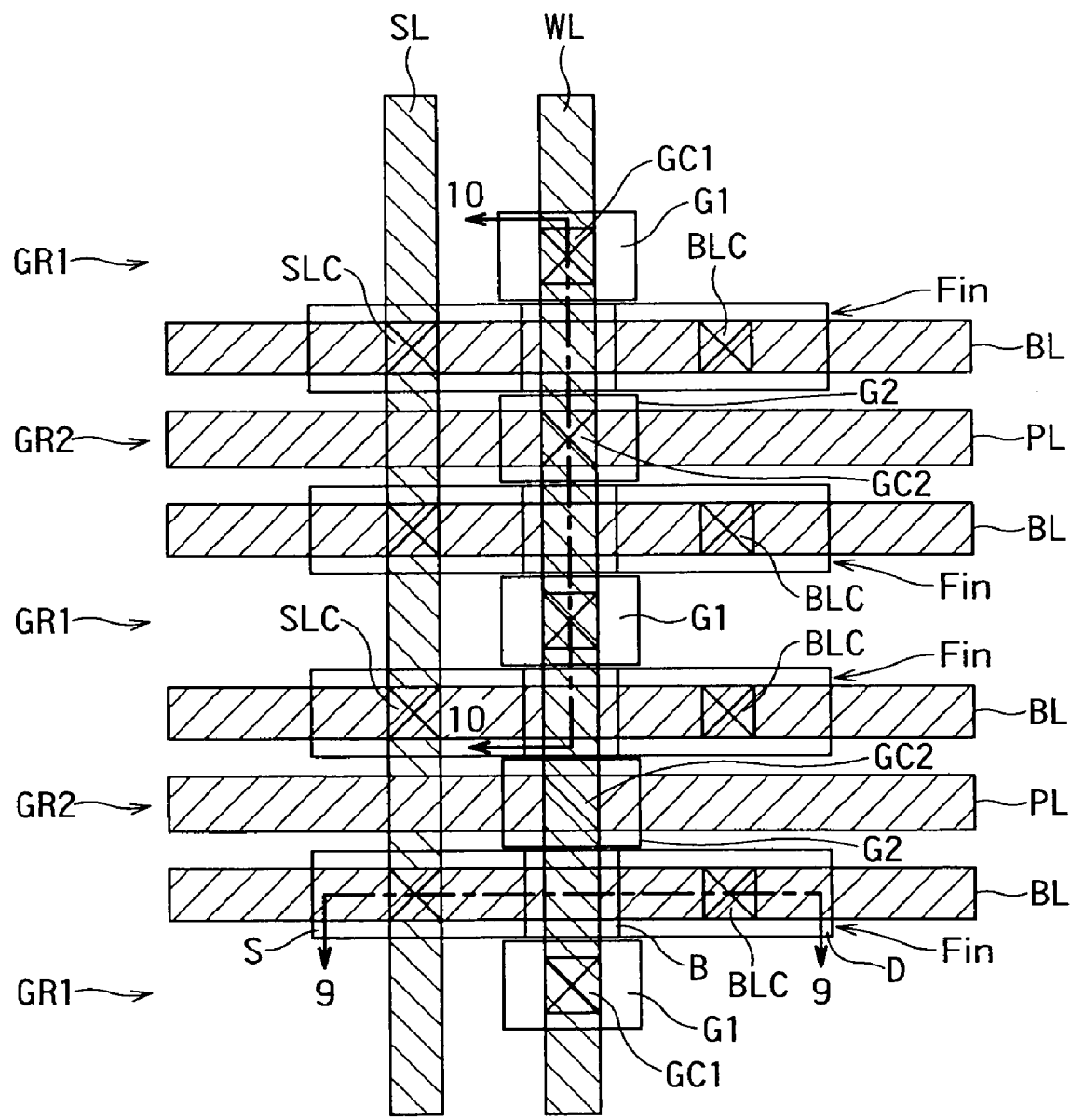
FIG. 8 is plan view of an FBC memory device according to a second embodiment of the present invention.
Figure 9:
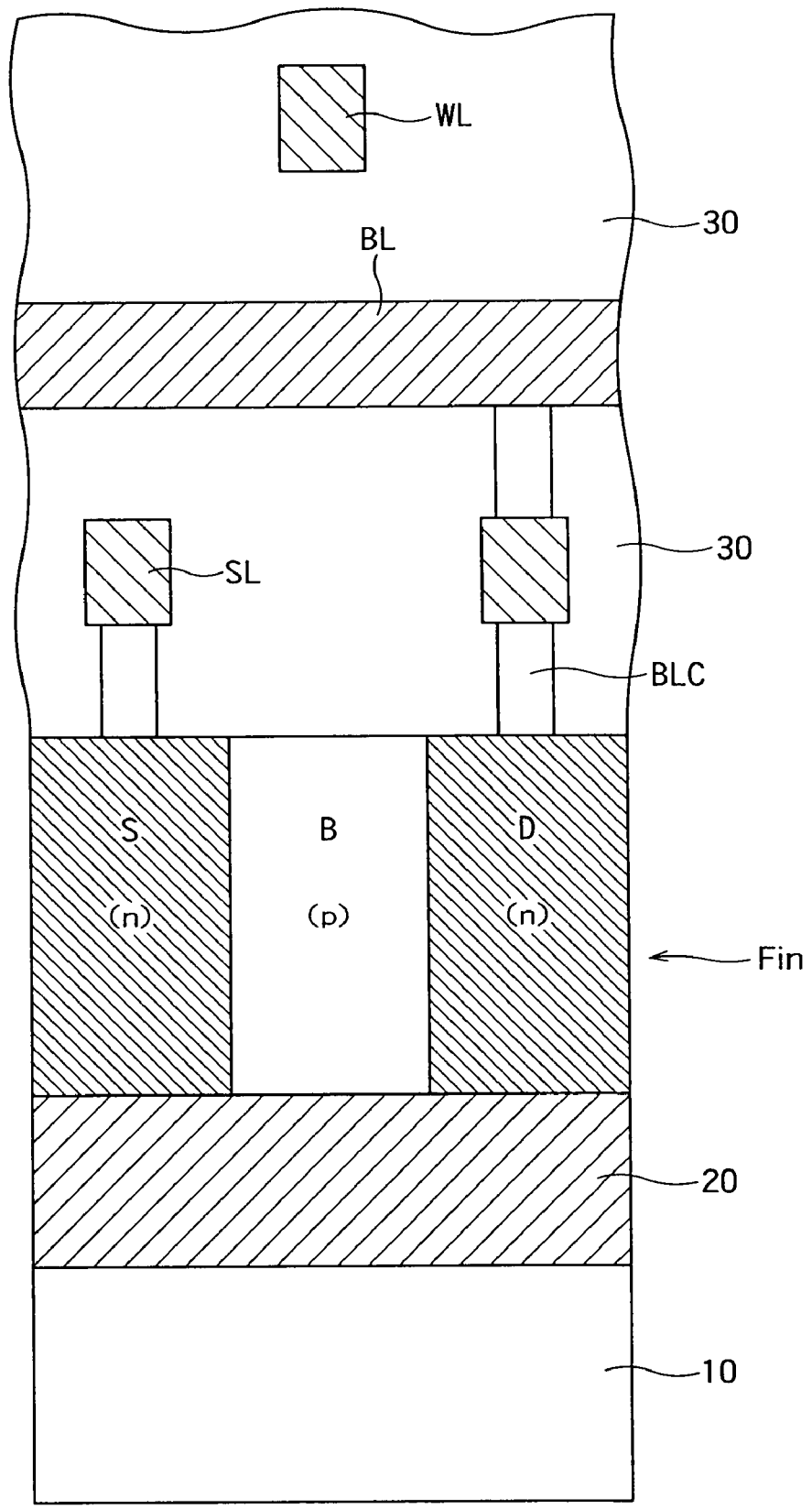
FIG. 9 is a cross-sectional view of one memory cell MC taken along a line 9-9 of FIG. 8.
Figure 10:
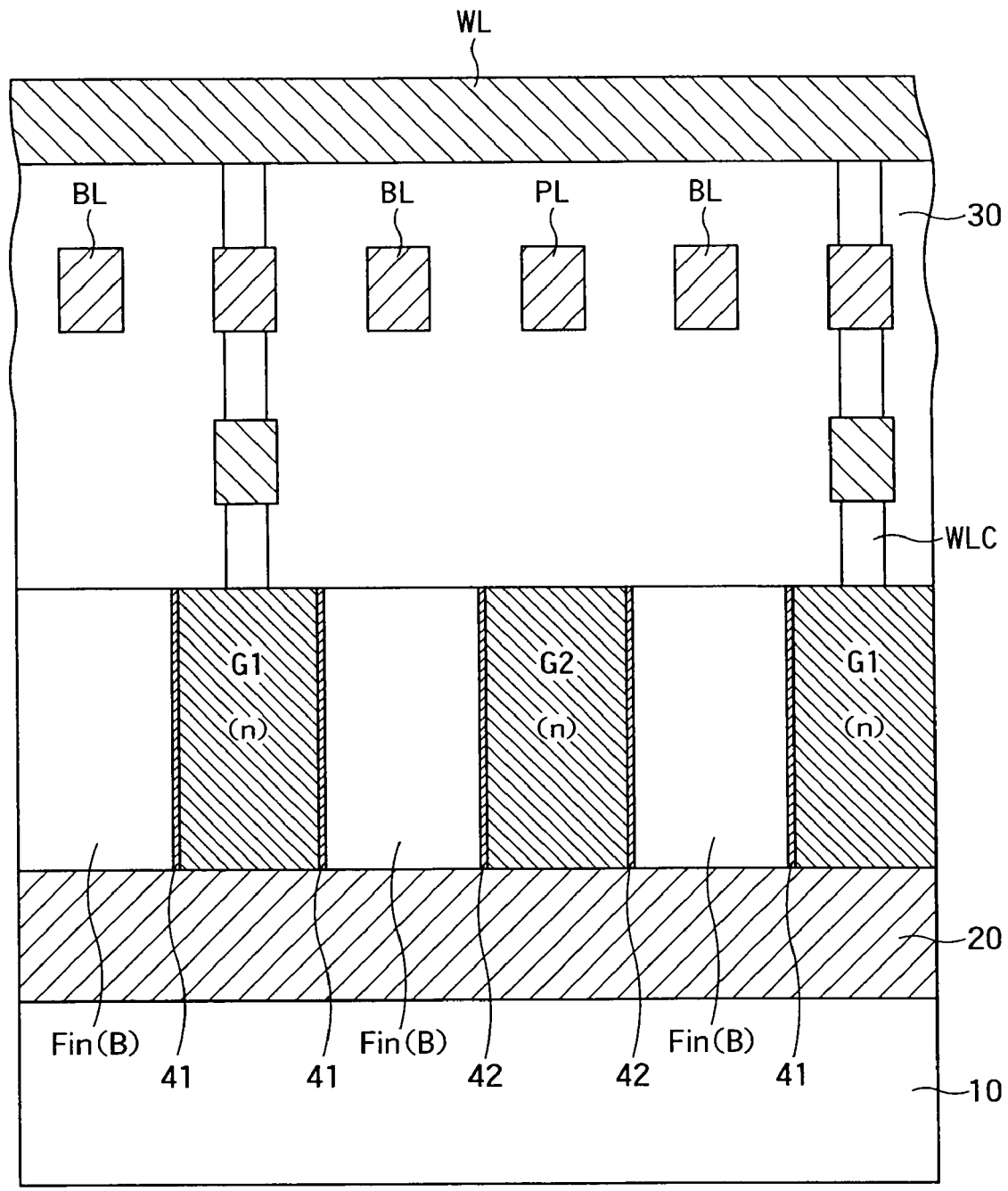
FIG. 10 is a cross-sectional view of the memory cells MCs taken along a line 10-10 of FIG. 8.
Figure 11:
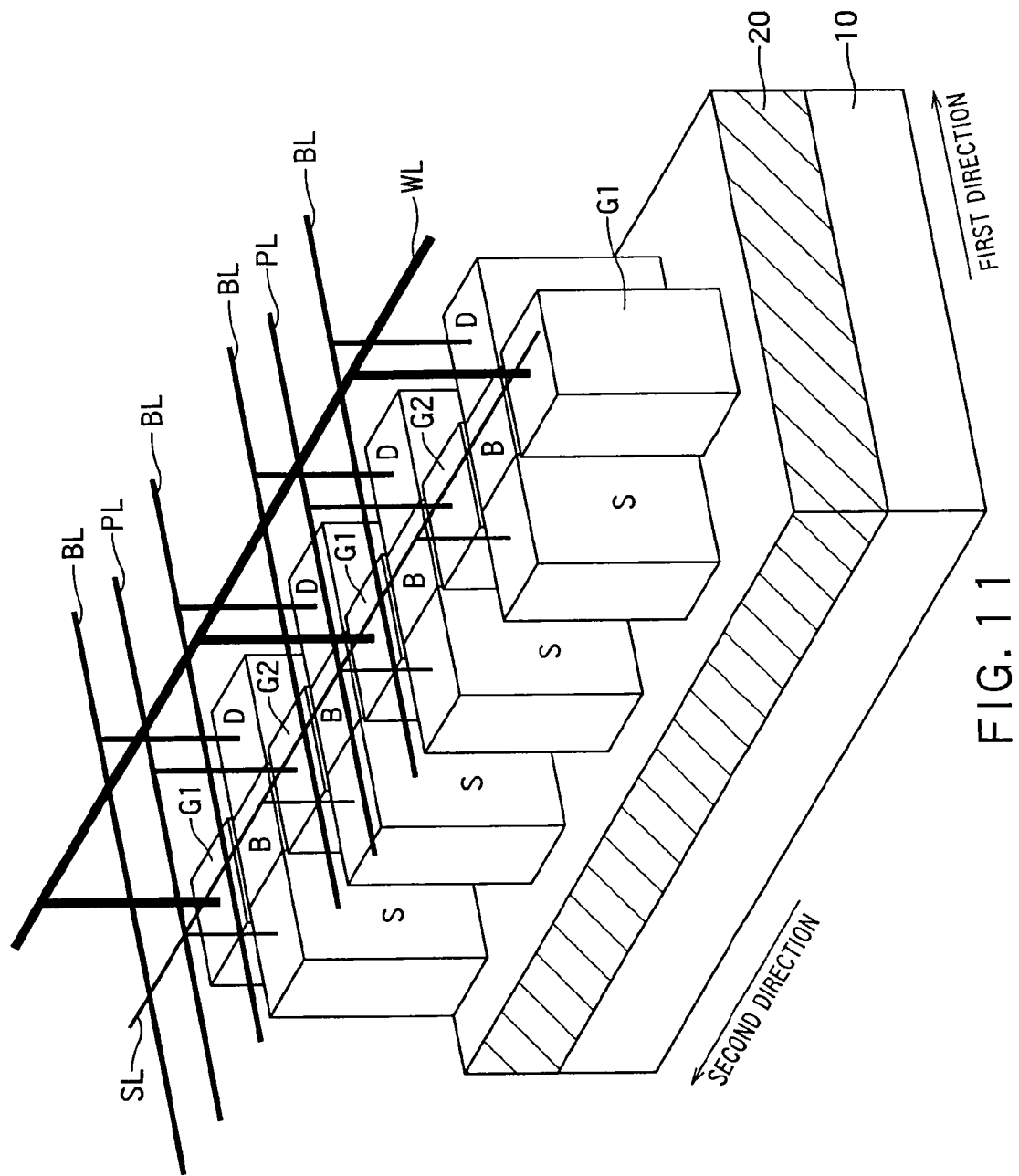
FIG. 11 is a perspective view of the FBC memory device according to the second embodiment.

FIG. 8 is plan view of an FBC memory device according to a second embodiment of the present invention. FIG. 9 is a cross-sectional view of one memory cell MC taken along a line 9-9 of FIG. 8. FIG. 10 is a cross-sectional view of the memory cells MCs taken along a line 10-10 of FIG. 8. FIG. 11 is a perspective view of the FBC memory device according to the second embodiment. A circuit diagram of the FBC memory device according to the second embodiment is identical to that shown in FIG. 1.

In the first embodiment, one plate line PL is formed in each second groove GR2, and functions as both the second gate electrode (back gate) and the plate line. In the second embodiment, second gate electrodes G2 that function as back gates are provided separately from the plate lines PLs. In this case, as shown in FIGS. 8 and 11, it is necessary to provide divided second gate electrodes G2 and arrange each divided second gate electrode G2 to correspond to the two memory cells MCs adjacent to each other in the first direction similarly to the first gate electrodes G1. The plate lines PLs and the bit lines BLs are formed on the same wiring layer. Other configurations of the FBC memory device according to the second embodiment are identical to those according to the first embodiment. Moreover, waveforms indicating operation performed by the FBC memory device according to the second embodiment are identical to those shown in FIG. 6.

In the second embodiment, the plate lines PLs should be arranged using metal. Accordingly, the minimum number of wiring layers is three and the wiring layers are more than those according to the first embodiment by one. For example, as shown in FIG. 9, the source lines SLs are formed on a metal wiring layer that is a first layer, the bit lines BLs and the plate lines PLs are formed on a metal wiring layer that is a second layer, and the word lines WLs are formed on a metal wiring layer that is a third layer. As evident from FIG. 10, the plate lines PLs are formed on the second metal wiring layer. Despite an increase in the minimum number of wiring layers, the second embodiment has an advantage of facilitating manufacturing since shapes of polysilicon are symmetric at the both sides of the Fin semiconductor. Furthermore, the second embodiment can exhibit the same advantages as those of the first embodiment.

Modification of Second Embodiment

Figure 12:
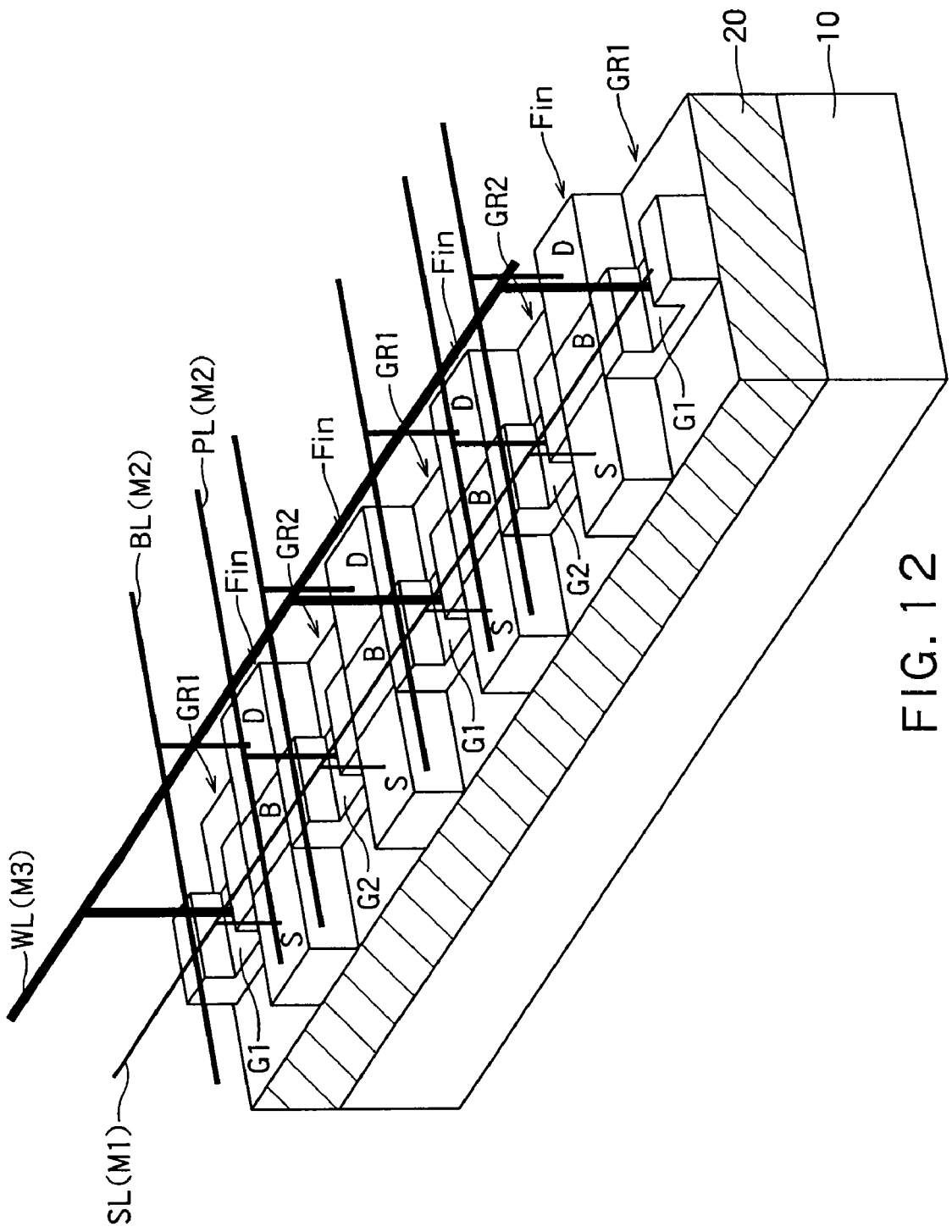
FIG. 12 is a perspective view of an FBC memory device according to a modification of the second embodiment.

In the second embodiment, the first gate electrodes G1 and the second electrodes G2 are filled up in the first grooves GR1 and the second grooves R2, respectively up to an upper surface level of each of the Fin semiconductors. Namely, each of the first gate electrodes G1 and the second electrodes G2 is a rectangular parallelepiped. However, it suffices that the first gate electrodes G1 and the second electrodes G2 are filled up in the side surfaces of the Fin semiconductors up to the upper surface level of each Fin semiconductor. Namely, as shown in FIG. 12, it suffices that each of the first gate electrodes G1 and the second electrodes G2 can be configured to be recessed in a central portion of the upper surface of each Fin semiconductor. In this case, each first gate electrode G1 and each second electrode G2 are formed into concave shapes along inside surfaces of the first and second grooves GR1 and GR2, respectively in a cross section in the perpendicular direction to the first direction. If the first and second grooves GR1 and GR2 are sufficiently wide relatively to a thickness of poly- silicon that is a material for the first gate electrodes G1 and the plate lines PLs, the first gate electrodes G1 and the plate lines PLs are formed as shown in FIG. 12. This modification has the same advantages as those of the second embodiment.

Third Embodiment

Figure 13:
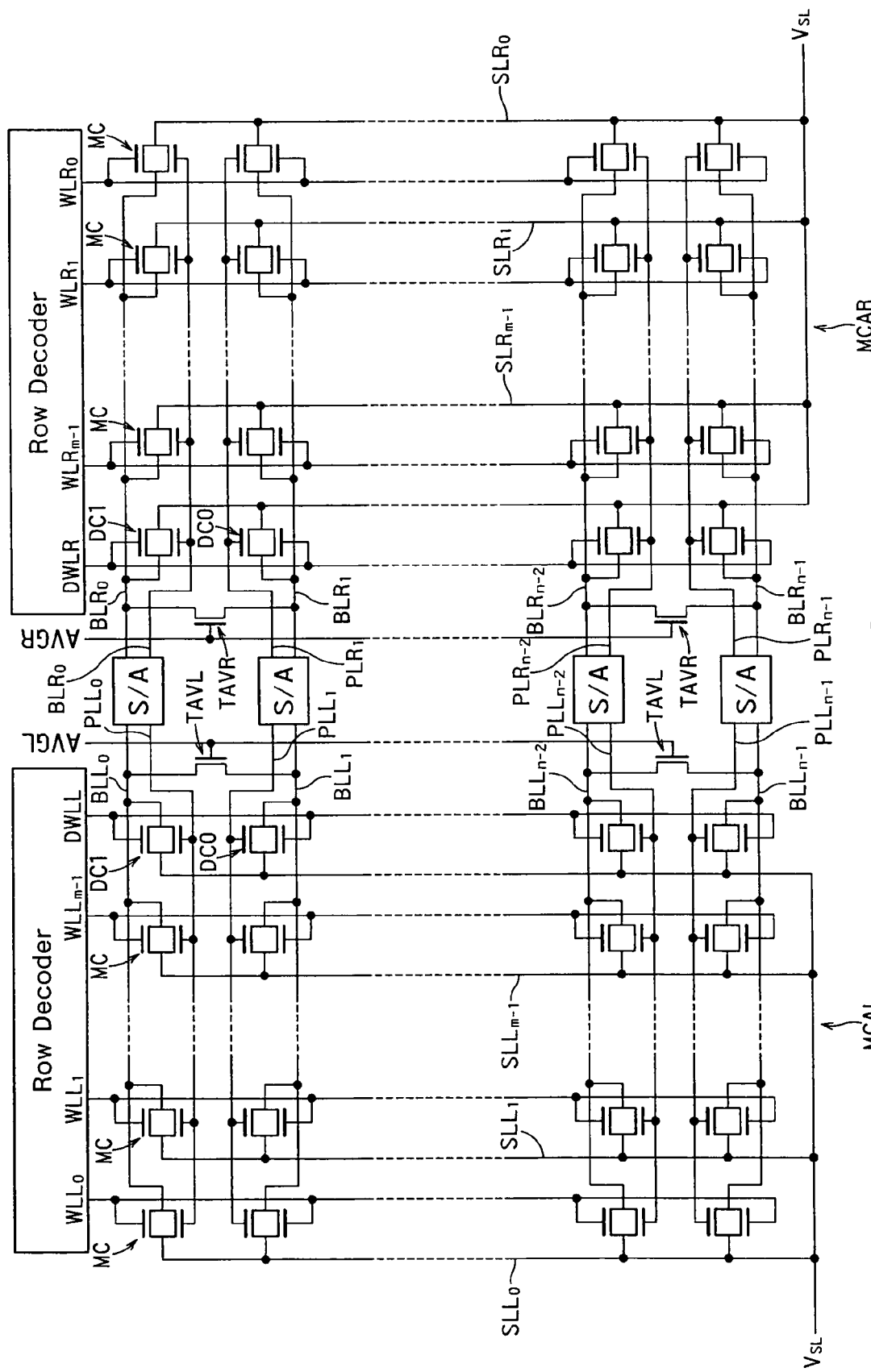
FIG. 13 is a circuit diagram of an FBC memory device according to a third embodiment of the present invention.

FIG. 13 is a circuit diagram of an FBC memory device according to a third embodiment of the present invention. In the third embodiment, plate lines PLs are provided to correspond to bit lines BLs, respectively. Each of the plate lines PLs is connected to a sense amplifier S/A connected to the bit line BL corresponding to the plate line PL. Other configurations in the third embodiment can be the same as those of the first or second embodiment.

The plate lines PLs are provided to correspond to the bit lines BLs in respective columns and connected to the respective sense amplifiers S/As. By adopting such a configuration, each of the sense amplifiers S/A can selectively drive a specific plate line PL.

Figure 14:
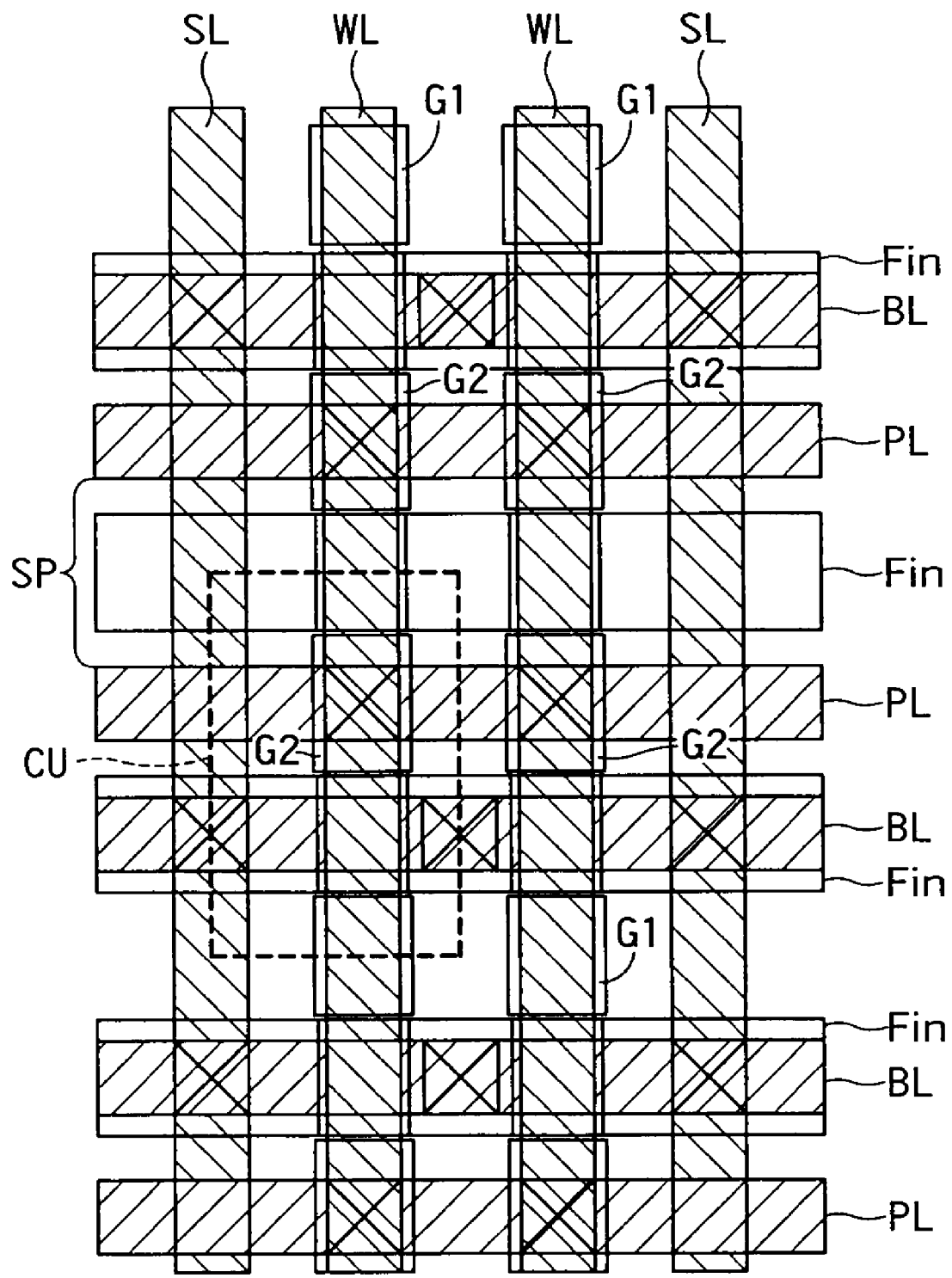
FIG. 14 is a plan view of the FBC memory device according to the third embodiment.

FIG. 14 is a plan view of the FBC memory device according to the third embodiment. To provide the plate lines PLs to correspond to the respective bit lines BLs, it is necessary to separate two second gate electrodes G2 adjacent to each other in the second direction. In other words, it is necessary to divide one second gate electrode G2 according to the second embodiment into two segments along the first direction. Accordingly, one space unit SP extending in the first direction is provided between the two adjacent second gate electrodes G2. One Fin semiconductor is provided in the space unit SP. No memory cells MCs are formed in the Fin semiconductor provided in the space unit SP, so that the Fin semiconductor in the space unit SP is used solely to electrically separate the two second gate electrodes G2 adjacent to each other in the second direction.

By adopting such a configuration, a cell unit CU indicating one unit of a memory cell MC is large, as compared with the first embodiment.

Nevertheless, each sense amplifier S/A can select memory cells MCs located at cross points between the word lines WLs and the corresponding plate line PL by using the word lines WLs and the corresponding plate lines PL. The sense amplifier S/A can thereby write data to the selected memory cell MC by selectively driving one word line WLs and one plate line PL. For example, if data "0" is to be written to the memory cell MC, a potential of the word line WL and a potential of the plate line PL rise to high potentials. Each of the memory cells MCs located at the cross points between the word lines WLs and the plate line PL can thereby discharge holes accumulated in the body B efficiently in short time by receiving potential fluctuations from both the first gate electrode (front gate) G1 and the second gate electrode (back gate) G2. An operation for writing data "1" is identical to that according to the first embodiment.

Modification of Third Embodiment

Figure 15:
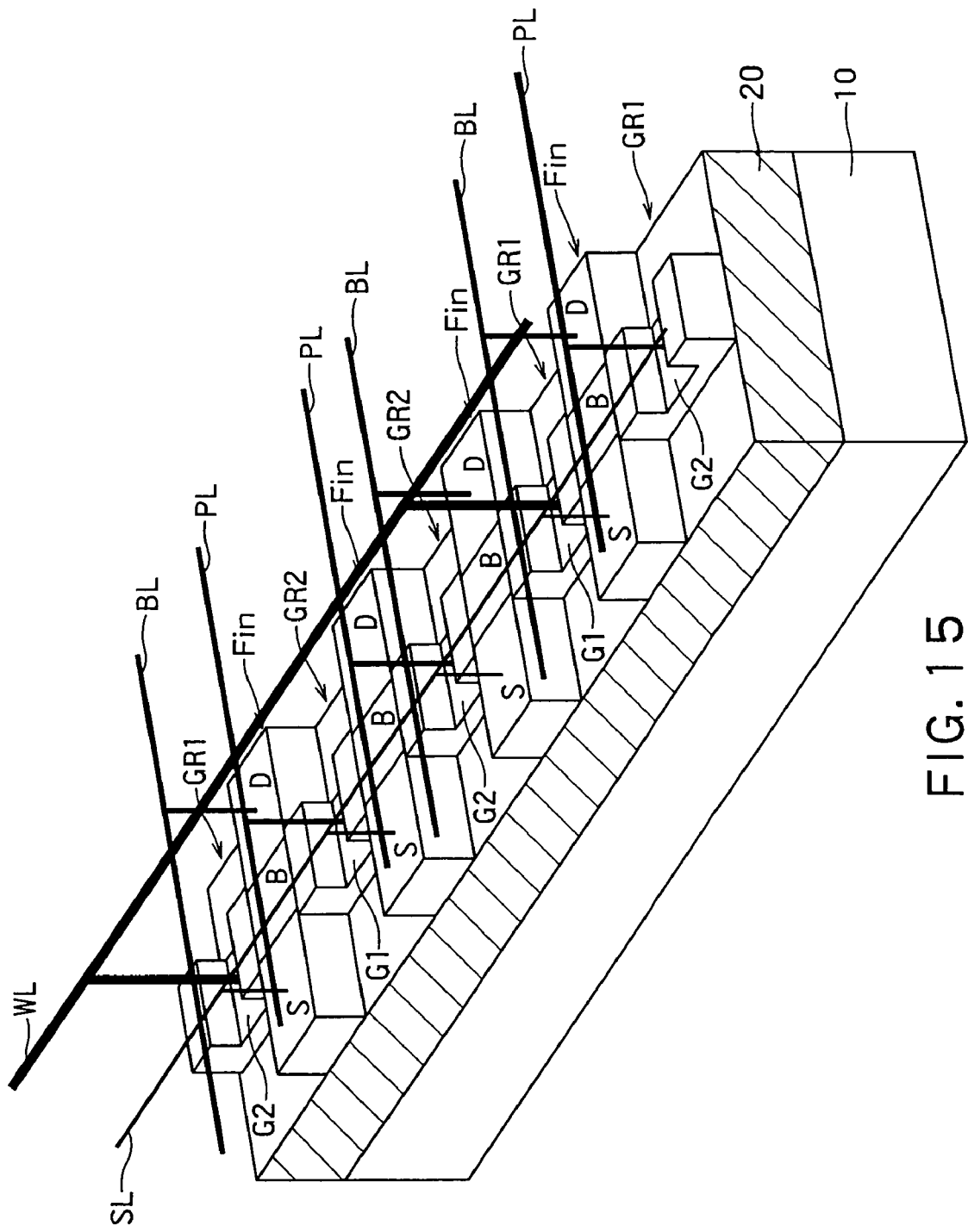
FIG. 15 is a perspective view of an FBC memory device according to a modification of the third embodiment.

In the third embodiment, the first gate electrodes G1 and the second gate electrodes G2 are filled up in the first grooves GR1 and the second grooves GR2, respectively up to an upper surface level of each of the Fin semiconductors. Namely, each of the first gate electrodes G1 and the second grooves GR2 is a rectangular parallelepiped. However, it suffices that the first gate electrodes G1 and the second grooves GR2 are filled up in the side surfaces of the Fin semiconductors up to the upper surface level of each Fin semiconductor. Namely, as shown in FIG. 15, it suffices that each of the first gate electrodes G1 and the second grooves GR2 can be configured to be recessed in a central portion of the upper surface of each Fin semiconductor. In this case, each first gate electrode G1 and each second groove GR2 are formed into concave shapes along inside surfaces of the first and second grooves GR1 and GR2, respectively in a cross section in the perpendicular direction to the first direction. If the first and second grooves GR1 and GR2 are sufficiently wide relatively to a thickness of polysilicon that is a material for the first gate electrodes G1 and the plate lines PLs, the first gate electrodes G1 and the second grooves GR2 are formed as shown in FIG. 15. This modification has the same advantages as those of the third embodiment.

In the first to third embodiments described so far, each of the memory cells MCs and the dummy cells DCs is an N-type FinFET. Alternatively, each of the memory cells MCs and the dummy cells DCs can be a P-type FinFET. In this alternative, charges accumulated in the body B of each memory cell MC or each dummy cell DC are electrons. Further, potentials of the bit lines BLs and the word lines WLs during operations are logically inverted from those described in the first to third embodiments.

What is claimed is:

1. A semiconductor memory device comprising:
   a plurality of Fin semiconductors extending in a first direction;
   source layers provided in the Fin semiconductors;
   drain layers provided in the Fin semiconductors;
   floating bodies provided in the Fin semiconductors between the source layers and the drain layers, the floating bodies being in an electrically floating state and accumulating or discharging carries so as to store data;
   first gate electrodes provided in first grooves located between the Fin semiconductors adjacent to each other;
   second gate electrodes provided in second grooves adjacent to the first grooves and located between the Fin semiconductors adjacent to each other;
   bit lines connected to the drain layers, and extending in a first direction;
   word lines connected to the first gate electrodes, and extending in a second direction orthogonal to the first direction; and
   source lines connected to the source layers, and extending in the second direction.

2. The semiconductor memory device according to claim 1, wherein
   one of the source layers, one of the drain layers, one of the floating bodies, one of the first gate electrodes, and one of the second gate electrodes form a memory cell storing the data,
   the source layer is shared between two memory cells respectively located on both sides of the source layer, and adjacent to each other in the first direction,
   the drain layer is shared between two memory cells respectively located on both sides of the drain layer, and adjacent to each other in the first direction,
   the first gate electrode is shared between two memory cells respectively located on both sides of the first gate electrode, and adjacent to each other in the second direction, and
   the second gate electrode is shared between two memory cells respectively located on both sides of the second gate electrode, and adjacent to each other in the second direction.

3. The semiconductor memory device according to claim 1, wherein the second gate electrodes extend in the first direction in the second grooves.

4. The semiconductor memory device according to claim 3, wherein
   the source lines and the word lines are formed by using a first wiring layer, and
   the bit lines are formed by using a second wiring layer.

5. The semiconductor memory device according to claim 3, wherein a potential of the source lines and a potential of the plate lines are kept to constant potentials, respectively.

6. The semiconductor memory device according to claim 3, wherein the first gate electrodes and the second gate electrodes are formed into concave shapes along inside surfaces of the first grooves and the second grooves, respectively in a cross section in a perpendicular direction to the first direction.

7. The semiconductor memory device according to claim 1, comprising a plurality of plate lines connected to the second gate electrodes, and extending in the first direction.

8. The semiconductor memory device according to claim 7, wherein
   the source lines are formed by using a first wiring layer,
   the bit lines and the plate lines are formed by using a second wiring layer, and
   the word lines are formed by using a third wiring layer.

9. The semiconductor memory device according to claim 7, wherein a potential of the source lines and a potential of the plate lines are kept to constant potentials, respectively.

10. The semiconductor memory device according to claim 7, wherein the first gate electrodes and the second gate electrodes are formed into concave shapes along inside surfaces of the first grooves and the second grooves, respectively in a cross section in a perpendicular direction to the first direction.

11. The semiconductor memory device according to claim 1, comprising a plurality of plate lines connected to the second gate electrodes, extending in the first direction, and provided to correspond to the bit lines, respectively.

12. The semiconductor memory device according to claim 11, wherein
   one of the source layers, one of the drain layers, one of the floating bodies, one of the first gate electrodes, and one of the second gate electrodes form a memory cell storing the data, and
   the data is selectively written to the memory cell located at a cross point between one of the word lines and one of the plate lines using the one of the word lines and the one of the plate lines.

13. The semiconductor memory device according to claim 12, further comprising a plurality of sense amplifiers reading the data stored in the memory cell or writing the data to the memory cell, wherein the plate lines are connected to the sense amplifiers, respectively.

14. The semiconductor memory device according to claim 11, further comprising a space portion separating two second gate electrodes adjacent to each other in the second direction.

15. The semiconductor memory device according to claim 11, wherein the first gate electrodes and the second gate electrodes are formed into concave shapes along inside surfaces of the first grooves and the second grooves, respectively in a cross section in a perpendicular direction to the first direction.

* * * * *